(12) United States Patent
Chih et al.

(10) Patent No.: US 7,626,224 B2
(45) Date of Patent: Dec. 1, 2009

(54) SEMICONDUCTOR DEVICE WITH SPLIT GATE MEMORY CELL AND FABRICATION METHOD THEREOF

(75) Inventors: Yue-Der Chih, Hsinchu (TW); Shine Chung, Taipei (TW); Wen-Ting Chu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 197 days.

(21) Appl. No.: 11/531,295

(22) Filed: Sep. 13, 2006

(65) Prior Publication Data
US 2008/0061354 A1 Mar. 13, 2008

(51) Int. Cl.
*H01L 29/788* (2006.01)
(52) U.S. Cl. ............ 257/316; 257/321; 257/E29.3
(58) Field of Classification Search ......... 257/314–317, 257/321, E21.422, E21.683, E29.3
See application file for complete search history.

(56) References Cited

U.S. PATENT DOCUMENTS

| | | | | |
|---|---|---|---|---|
| 5,006,974 | A | * | 4/1991 | Kazerounian et al. ......... 363/60 |
| 5,747,849 | A | * | 5/1998 | Kuroda et al. ............... 257/321 |
| 2003/0142550 | A1 | * | 7/2003 | Kawahara et al. ....... 365/185.28 |
| 2005/0079662 | A1 | * | 4/2005 | Miki .......................... 438/200 |

FOREIGN PATENT DOCUMENTS

JP 11-026729 1/1999

OTHER PUBLICATIONS

English abstract of JP11-026729, dated Jan. 29, 1999.

\* cited by examiner

*Primary Examiner*—Anh Phung
*Assistant Examiner*—Allison P Bernstein
(74) *Attorney, Agent, or Firm*—Thomas, Kayden, Horstemeyer & Risley

(57) ABSTRACT

A split gate memory cell. First and second well regions of respectively first and second conductivity types are formed in the substrate. A floating gate is disposed on a junction of the first and second well regions and insulated from the substrate. A control gate is disposed over the sidewall of the floating gate and insulated from the substrate and the floating gate and partially extends to the upper surface of the floating gate. A doping region of the first conductivity type is formed in the second well region. The first well region and the doping region respectively serve as source and drain regions of the split gate memory cell.

13 Claims, 9 Drawing Sheets

SEMICONDUCTOR DEVICE WITH SPLIT GATE MEMORY CELL AND FABRICATION METHOD THEREOF

BACKGROUND OF THE INVENTION

1. Field of the Invention

The invention relates to semiconductor memory and in particular to a split gate memory cell and a fabrication method thereof.

2. Description of the Related Art

Semiconductor memory devices commonly take various forms, such as EPROMs, EEPROMs, and flash memory devices. Currently, flash memory, such as a split gate flash memory is widely applied in large capacity non-volatile memory technology. Typically, the split gate flash memory includes a split gate structure having a floating gate for charge storage and a control gate to control the charge storage. The split gate structure may further include a thin gate dielectric or tunnel oxide film formed between the floating gate and the substrate and an intermediate dielectric film formed between the floating gate and the control gate.

FIG. 3 is a cross section of a conventional split gate memory cell. The split gate memory cell includes a semiconductor substrate 300. A polysilicon floating gate 306 is disposed on the substrate 300 and insulated therefrom by a gate dielectric layer 304. A polysilicon control gate (i.e. word line) 312 is laterally adjacent to the floating gate 306 and insulated therefrom by an interpoly dielectric layer 310 and a thicker cap oxide layer 308 formed by local oxidation of silicon (LOCOS). A source region 301 and a drain region 303 are formed in the substrate 300 on both sides of the split gate structure.

To integrate the split gate memory cells on a chip with the peripheral circuits, additional lithography steps are required. Each additional lithography step requires a respective different mask or reticule, with the cost of masks for lithography high.

Thus, there exists a need in the art for an improved split gate memory cell with fewer lithography steps during manufacture of split gate memory cells.

BRIEF SUMMARY OF INVENTION

A detailed description is given in the following embodiments with reference to the accompanying drawings. A split gate memory cell, a semiconductor device and a method for forming the semiconductor device are provided. An embodiment of a split gate memory cell comprises a substrate. First and second well regions of respectively first and second conductivity types are formed in the substrate. A floating gate is disposed on a junction of the first and second well regions and insulated from the substrate. A control gate is disposed over the sidewall of the floating gate and insulated from the substrate and the floating gate, partially extending to the upper surface of the floating gate. A doping region of the first conductivity type is formed in the second well region. The first well region and the doping region respectively serve as source and drain regions of the split gate memory cell.

An embodiment of a semiconductor device comprises a substrate having a cell region and a peripheral region. A split gate memory cell is disposed on the substrate of the cell region and a transistor is disposed on the substrate of the peripheral region. The split gate memory cell comprises first and second well regions of respectively first and second conductivity types formed in the substrate of the cell region. A floating gate is disposed on a junction of the first and second well regions and insulated from the substrate. A control gate is disposed over the sidewall of the floating gate and insulated from the substrate and the floating gate, partially extending to the upper surface of the floating gate. A first doping region of the first conductivity type is formed in the second well region near one side of the control gate. The transistor comprises a third well region of the first conductivity type formed in the substrate. A gate is disposed on the substrate of the third well region and insulated therefrom. A pair of second doping regions of the second conductivity type is formed in the third well region on both sides of the first gate.

An embodiment of a method for forming a semiconductor device comprises providing a substrate having a cell region and a peripheral region. A first well region of a first conductivity type is formed in the cell region and a second well region of the first conductivity type is simultaneously formed in the peripheral region. A third well region of a second conductivity type is formed in the cell region and a fourth well region of the second conductivity type is simultaneously formed in the peripheral region. A floating gate is formed on a junction of the first and third well regions. A control gate is formed over the sidewall of the floating gate, partially extending to the upper surface of the floating gate, and first and second gates are simultaneously and respectively formed in the second and fourth well regions. A first doping region is formed in the third well region near one side of the control gate and a pair of second doping regions is simultaneously formed in the fourth well region on both sides of the second gate. A pair of third doping regions is formed in the second well region on both sides of the first gate.

Another embodiment of a method for forming a semiconductor device comprises providing a substrate having a cell region and a peripheral region. A floating gate is formed on the substrate of the cell region. A first well region of a first conductivity type is formed in the cell region and partially overlaps the floating gate, and a second well region of the first conductivity type is simultaneously formed in the peripheral region. A third well region of a second conductivity type is formed in the cell region and partially overlaps the floating gate, and a fourth well region of the second conductivity type is simultaneously formed in the peripheral region. A control gate is formed over the sidewall of the floating gate and partially extends to the upper surface of the floating gate, and first and second gates are simultaneously and respectively formed in the second and fourth well regions. A first doping region is formed in the third well region near one side of the control gate and a pair of second doping regions is simultaneously formed in the fourth well region on both sides of the second gate. A pair of third doping regions is formed in the second well region on both sides of the first gate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
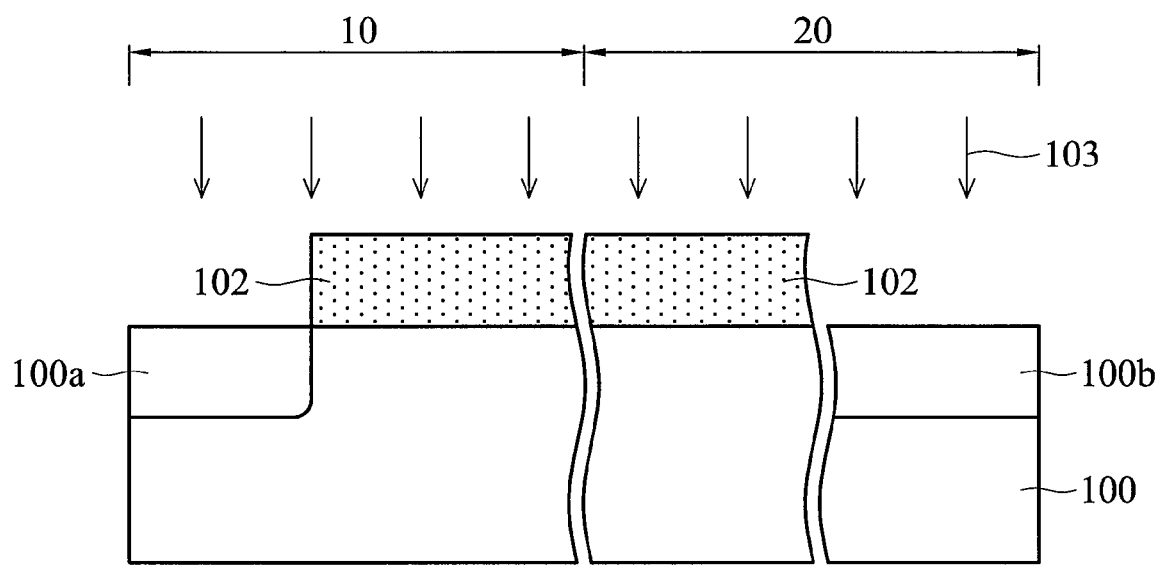
FIGS. 1A to 1G are cross sections of an embodiment of a method for forming a semiconductor device with a split gate memory cell.

The following description is of the best-contemplated mode of carrying out the invention. This description is provided for the purpose of illustrating the general principles of the invention and should not be taken in a limiting sense. The scope of the invention is best determined by reference to the appended claims. The semiconductor device with a split gate memory cell of this invention will be described below with reference to the accompanying drawings.

The invention relates to an improved split gate memory cell which reduces manufacturing costs and a method for fabricating the same. FIGS. 1G or 2G illustrate a cross section of an embodiment of a semiconductor device with a split gate memory cell. The semiconductor device comprises a substrate 100, such as a silicon substrate or other semiconductor substrate. The substrate 100 has a cell region 10 and a peripheral region 20, comprising isolation structures (not shown) formed therein. The isolation structures may comprise field oxides formed by conventional isolation technologies, such as local oxidation of silicon (LOCOS) or shallow trench isolation (STI). The isolation structures typically define active areas of the cell and peripheral regions 10 and 20 in the substrate 100, thereby forming split gate memory cells and logical circuit devices therein.

At least one split gate memory cell is disposed in the active area of the cell region 10, comprising adjacent well regions 100a and 100c formed in the substrate 100 of the cell region 10. The well regions 100a and 100c are of different conductivity types. For example, the well region 100a may be n-type and the well region 100c may be p-type. A floating gate 108a is disposed on a junction of the well regions 100a and 100c and insulated from the substrate 100 by a floating gate dielectric layer 106a. In this embodiment, the floating gate 108a may comprise polysilicon. The floating gate dielectric layer 106a may comprise silicon oxide, silicon nitride or other advantageous dielectric material, with silicon oxide preferable. A control gate (i.e. word line) 114a is disposed over the sidewall of the floating gate 108a and insulated from the substrate 100 and the floating gate 108a by an intermediate dielectric layer 112a, such as oxide, silicon nitride or other advantageous dielectric material. The control gate 110 may comprise polysilicon, partially extending to and directly on the upper surface of the floating gate 108a. A doping region 123a of the same conductivity type as the well region 100a is optionally formed in the well region 100a near one side of the floating gate 108a. Another doping region 123b of the same conductivity type as the well region 100a is formed in the well region 100c near one side of the control gate 114a. In this embodiment, the doping region 123a and the well region 100a serve as a source region of the split gate memory cell and the doping region 123b serves as a drain region of the split gate memory cell.

At least two transistors of different conductivity types are disposed in the active area of the peripheral region 20. One of the transistors comprises a well region 100b of the same conductivity type as the well region 100a formed in the substrate 100. A gate 114b, such as a polysilicon gate, is disposed on the substrate 100 of the well region 100b and insulated therefrom by a gate dielectric layer 112b. A pair of doping regions 125a and 125b of a conductivity type opposite to the well region 100b is formed in the well region 100b on both sides of the gate 114b to serve as source/drain regions of the transistor. The other transistor comprises a well region 100d of the same conductivity type as the well region 100c formed in the substrate 100. A gate 114c, such as a polysilicon gate, is disposed on the substrate 100 of the well region 100d and insulated therefrom by a gate dielectric layer 112c. A pair of doping regions 123c and 123d of a conductivity type opposite to the well region 100d is formed in the well region 100d on both sides of the gate 114c to serve as source/drain regions of the transistor.

Figure 1B:
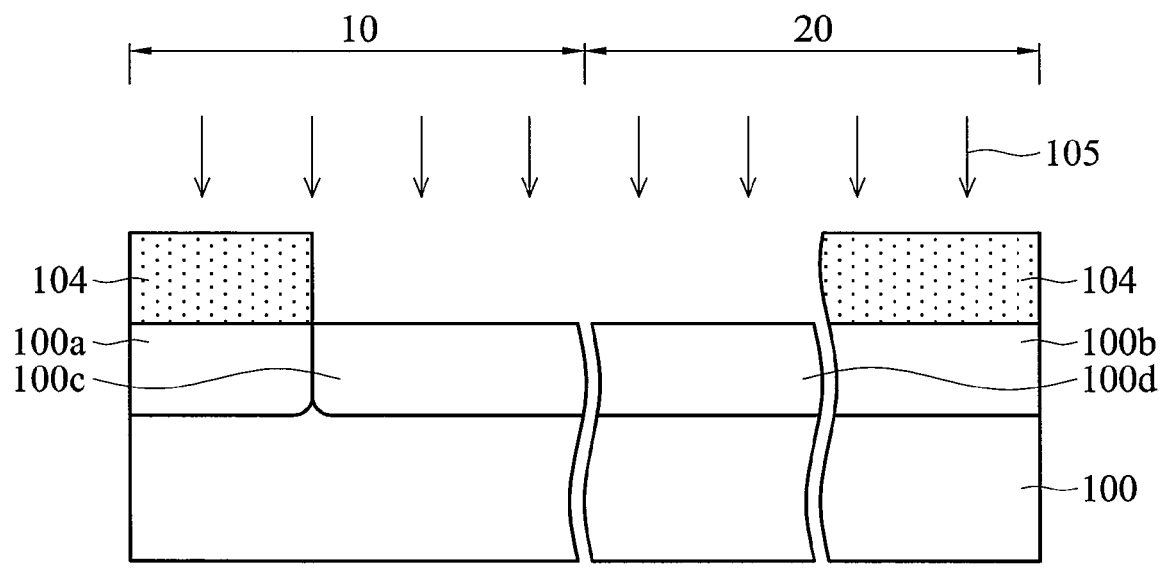
Figure 1C:
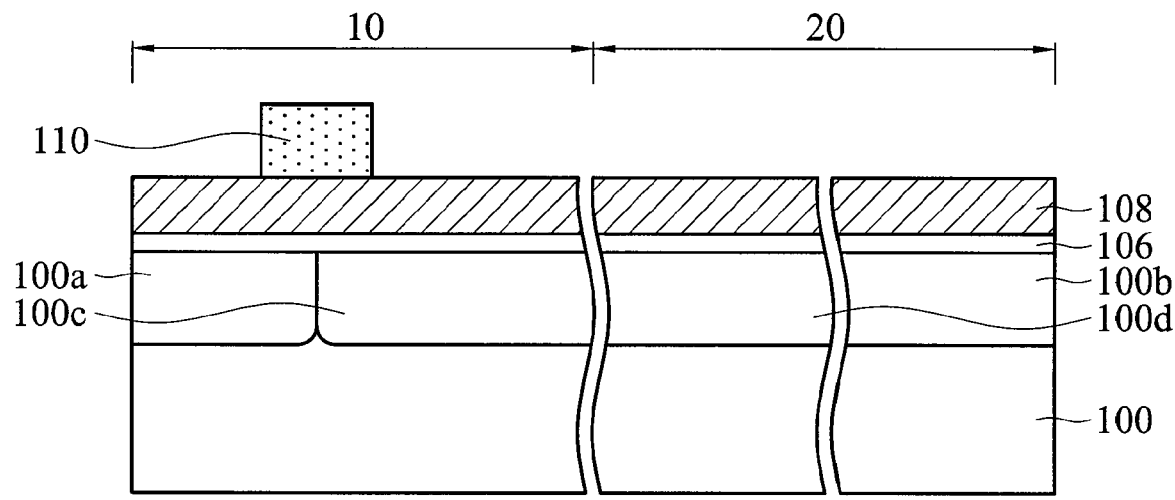
Figure 1D:
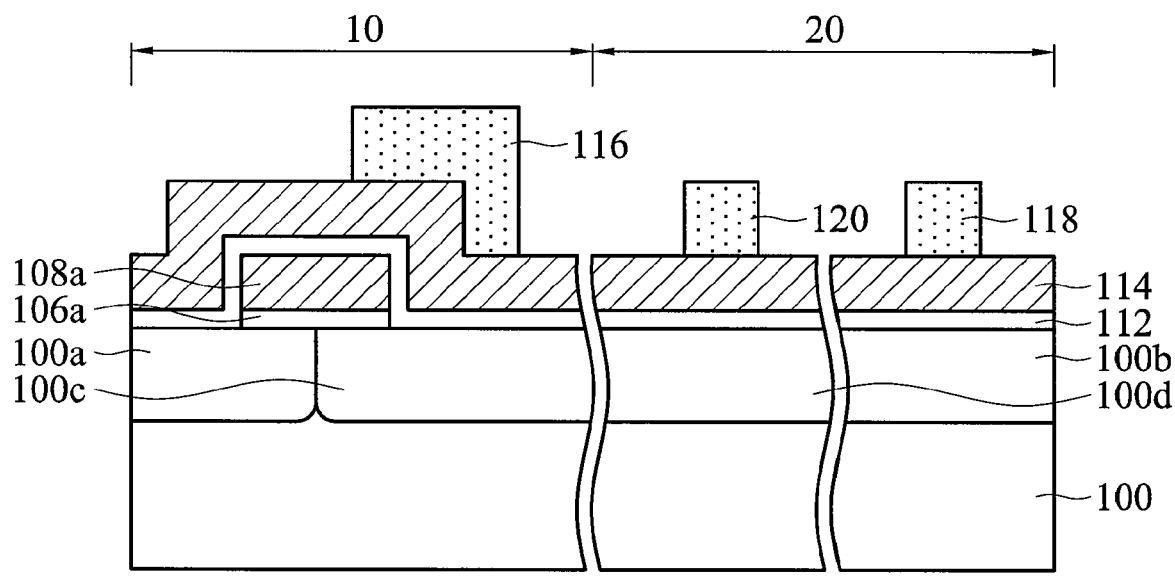
Figure 1E:
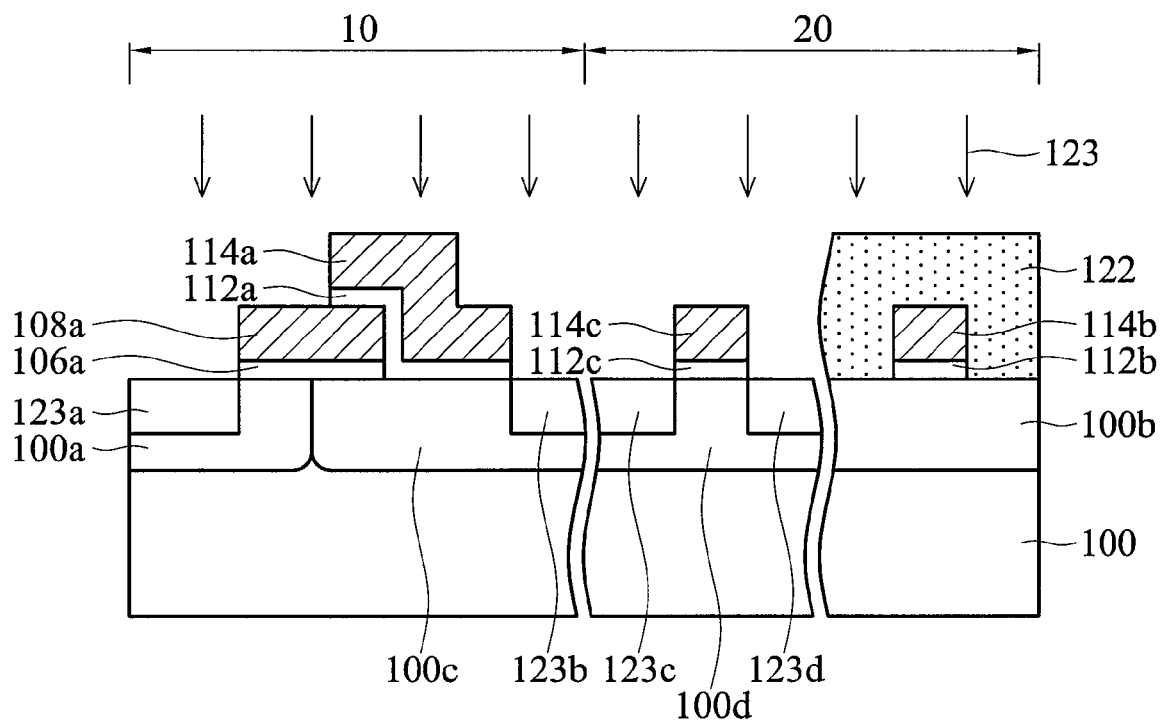
Figure 1F:
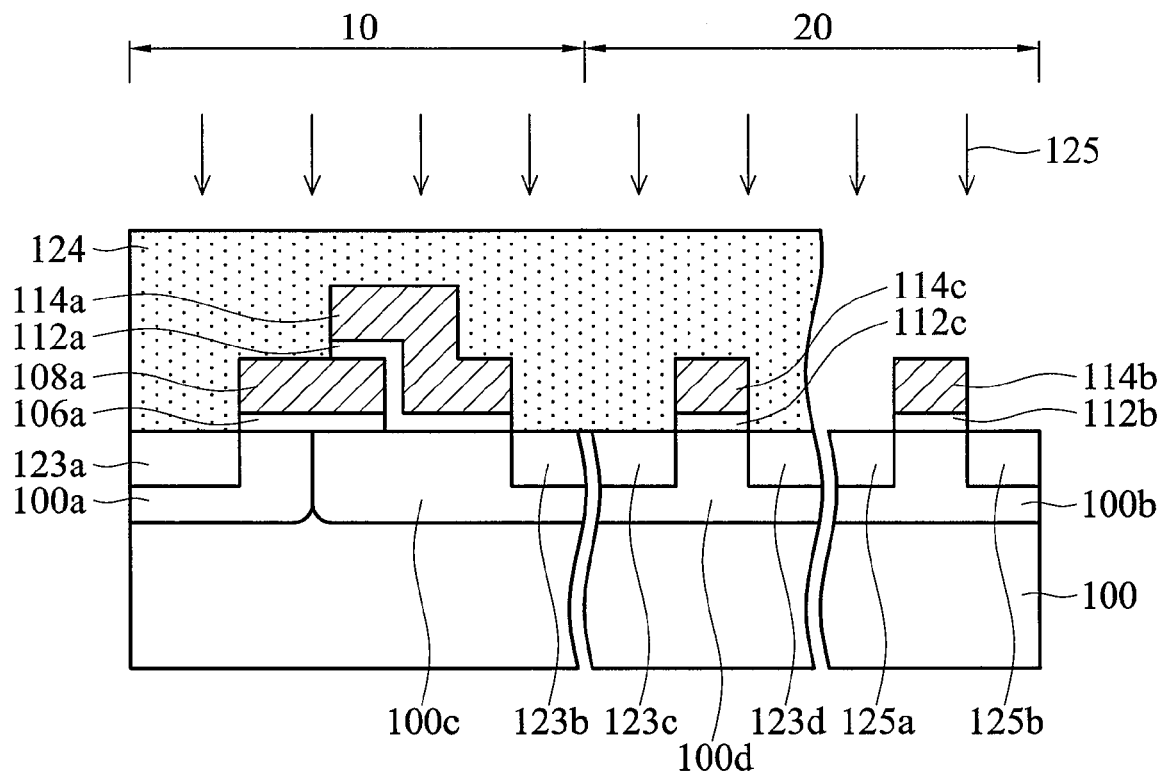
Figure 1G:
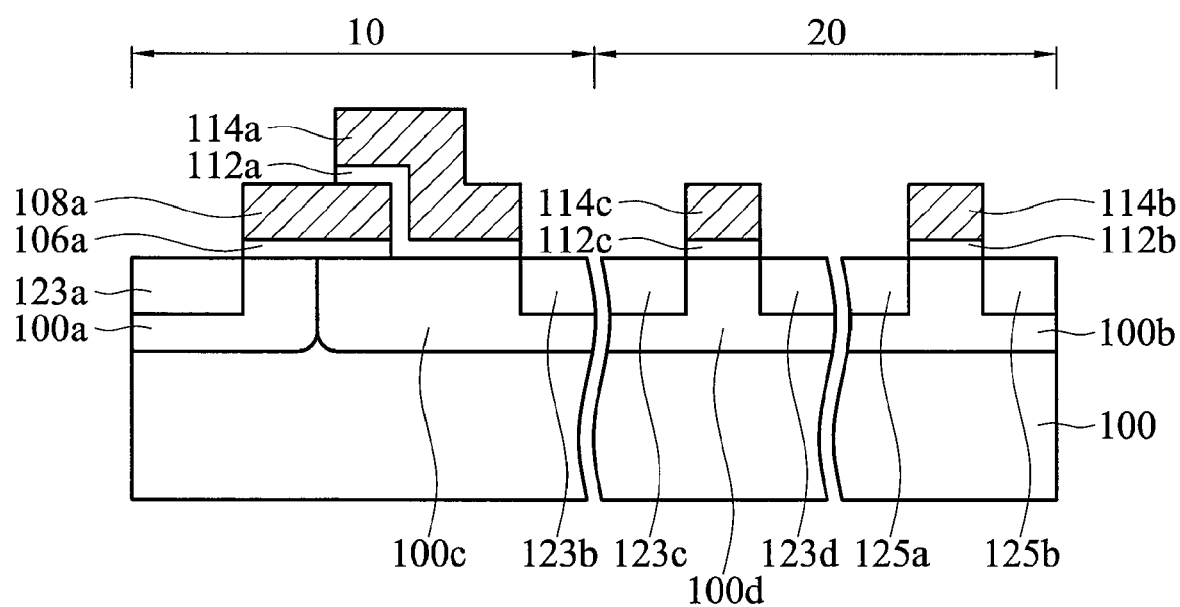

FIGS. 1A to 1G, illustrate cross sections of an embodiment of a method for forming a semiconductor device with split gate memory cell. As shown in FIG. 1A, a substrate 100, such as a silicon substrate or other semiconductor substrates is provided. The substrate 100 has cell and peripheral regions 10 and 20, comprising isolation structures (not shown) to define active areas of the cell and peripheral regions 10 and 20 in the substrate 100. The isolation structures can be field oxides formed by conventional LOCOS or STI technologies. Next, a photoresist layer 102 is formed on the substrate 100 of the cell and peripheral regions 10 and 20 by lithography. Ion implantation 103, such as arsenic (As) or phosphorus (P) ion implantation with a dosage of about $1\times10^{12}$ to $1\times10^{13}$ ion/cm$^2$, is performed using the photoresist layer 102 as an implant mask, to form a well region 100a in the cell region 10 and simultaneously form a well region 100b in the peripheral region 20. In this embodiment, the well regions 100a and 100b are n-type. In some embodiments, the well regions 100a and 100b can be p-type.

As shown in FIG. 1B, after removal of the unnecessary photoresist layer 102 shown in FIG. 1A, a photoresist layer 104 is formed on the substrate 100 by lithography to cover the well regions 100a and 100b. Ion implantation 105, such as boron (B) ion implantation with a dosage of about $1\times10^{12}$ to $1\times10^{13}$ ion/cm$^2$, is performed using the photoresist layer 104 as an implant mask, to form a well region 100c in the cell region 10 and simultaneously form a well region 100d in the peripheral region 20. In this embodiment, the well regions 100c and 100d have a conductivity type opposite to the well regions 100a and 100b, such as p-type.

As shown in FIG. 1C, after removal of the unnecessary photoresist layer 104 shown in FIG. 1B, a dielectric layer 106 and a conductive layer 108 are successively formed on the substrate 100 of the cell and peripheral regions 10 and 20. The dielectric layer 106 may comprise silicon oxide, silicon nitride or other advantageous dielectric material, formed by conventional deposition or thermal oxidation. Preferably, the dielectric layer 106 comprises silicon oxide formed by thermal oxidation. The conductive layer 108, such as a polysilicon layer, is formed by, for example, chemical vapor deposition (CVD). Thereafter, a photoresist layer 110 is formed on the conductive layer 108 above the junction of the well regions 100a and 100c, thereby defining a floating gate of the split gate memory cell.

As shown in FIG. 1D, the conductive layer 108 and the underlying dielectric layer 106 uncovered by the photoresist layer 110 are removed by etching to form a floating gate 108a and a floating gate dielectric layer 106a above the junction of the well regions 100a and 100c. After removal of the photoresist layer 110 shown in FIG. 1C, a conformal dielectric layer 112 is formed on the substrate 100 and the surface of the floating gates 108a. The conformal dielectric layer 112 may comprise oxide formed by CVD or thermal oxidation. A conformal conductive layer 114, such as a polysilicon layer, is subsequently formed on the conformal dielectric layer 112 by, for example, CVD or other deposition well known in the art. Thereafter, a photoresist layer 116 is formed on the conductive layer 114 above the well region 100c and photoresist layers 118 and 120 are simultaneously formed on the conductive layer 114 above the well regions 100b and 100d, respectively.

As shown in FIG. 1E, the conductive layer 114 and the underlying dielectric layer 112 are subsequently etched using the photoresist layers 116, 118 and 120 as an etch mask. As a result, a control gate 114a is formed over the sidewall of the floating gate 108a and partially extends to the upper surface of the floating gate 108a and an intermediate dielectric layer 112a is formed between the floating gate 108a and the control gate 114a and between the control gate 114a and the substrate 100. At the same time, a gate 114b and an underlying gate dielectric layer 112b are formed on the substrate 100 of the well region 100b and a gate 114c and an underlying gate dielectric layer 112c are formed on the substrate 100 of the well region 100d. After removal of the unnecessary photoresist layers 116, 118 and 120, a photoresist layer 122 is formed on the substrate 100 of the well region 100b covering the gate 114b. Thereafter, ion implantation 123 is performed on the substrate 100 to form a doping region 123a in the well region 100a near one side of the floating gate 108a, a doping region 123b in the well region 100c near one side of the control gate 114a and a pair of doping regions 123c and 123d in the well region 100d on both sides of the gate 114c. In some embodiments, only doping regions 123b, 123c and 123d may be formed in the substrate 100 using a photoresist layer (not shown) different from the photoresist layer 122. The doping regions 123a, 123b, 123c and 123d have the same conductivity type as the well region 100a. In this embodiment, the doping region 123a and the well region 100a serve as a source region of the split gate memory cell and the doping region 123b serves as a drain region of the split gate memory cell. Moreover, the pair of doping regions 123c and 123d serves as source/drain regions of the transistor comprising the gate 114c. In some embodiments, a drive in process may be optionally performed to laterally extend the doping regions 123a and 123b under the floating gate 108a and the control gate 114a, respectively, thus a split gate memory cell of the invention is completed.

As shown in FIG. 1F, after removal of the unnecessary photoresist layer 122, a photoresist layer 124 is formed on the substrate 100 of the cell region 10 and the well region 100d, covering the split gate memory cell and the gate 114c. Thereafter, ion implantation 135 is performed in the substrate 100 to form a pair of doping regions 125a and 125b in the well region 100b on both sides of the gate 114b. The pair of doping regions 125a and 123d serve as source/drain regions of the transistor comprising the gate 114b. The unnecessary photoresist layer 124 is subsequently removed, thus the semiconductor device of the invention is complete, as shown in FIG. 1G.

Figure 2A:
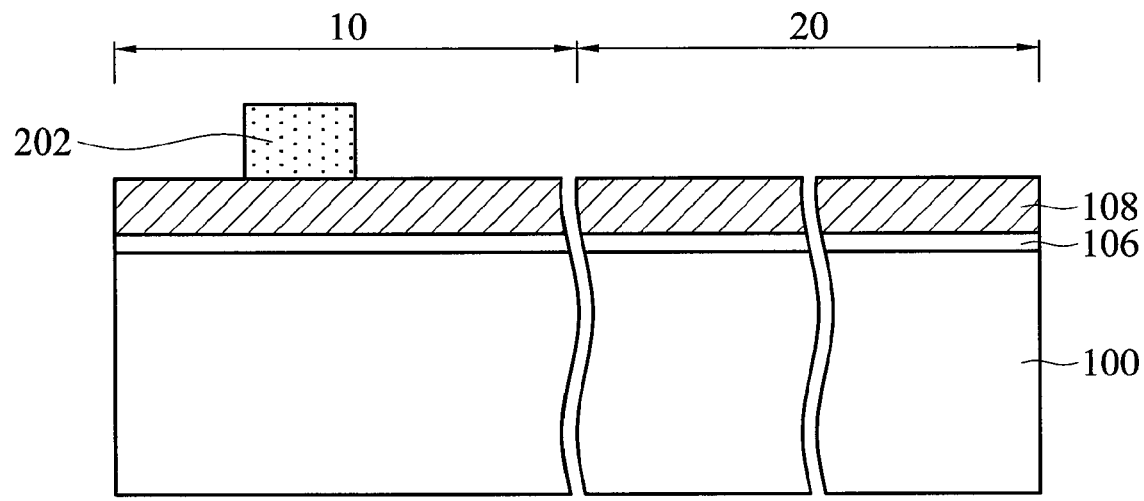
FIGS. 2A to 2G are cross sections of another embodiment of a method for forming a semiconductor device with a split gate memory cell.
Figure 2B:
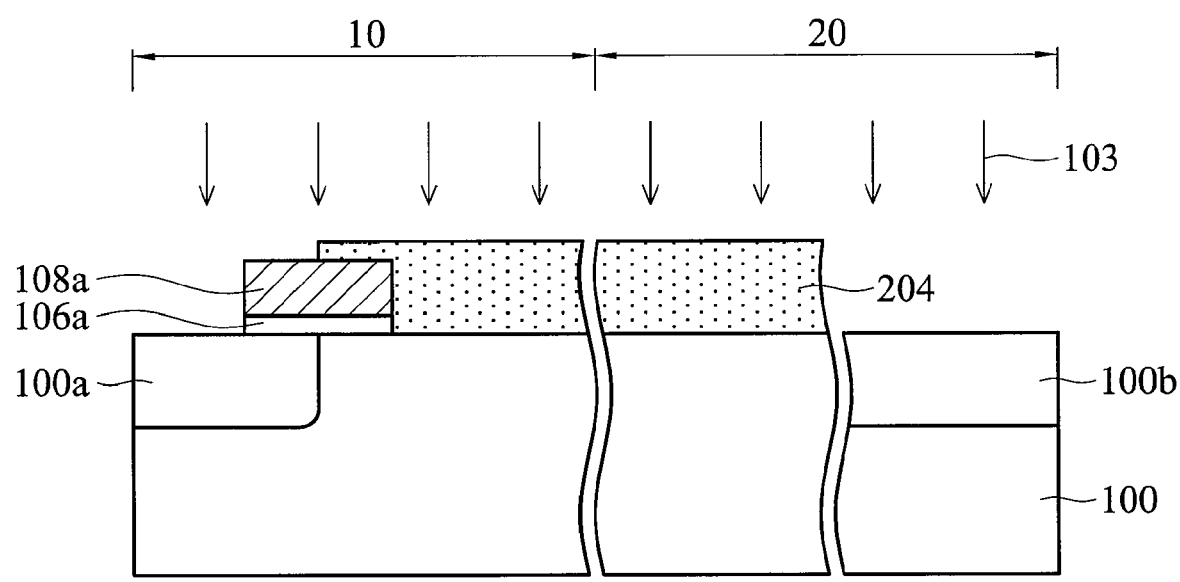
Figure 2C:
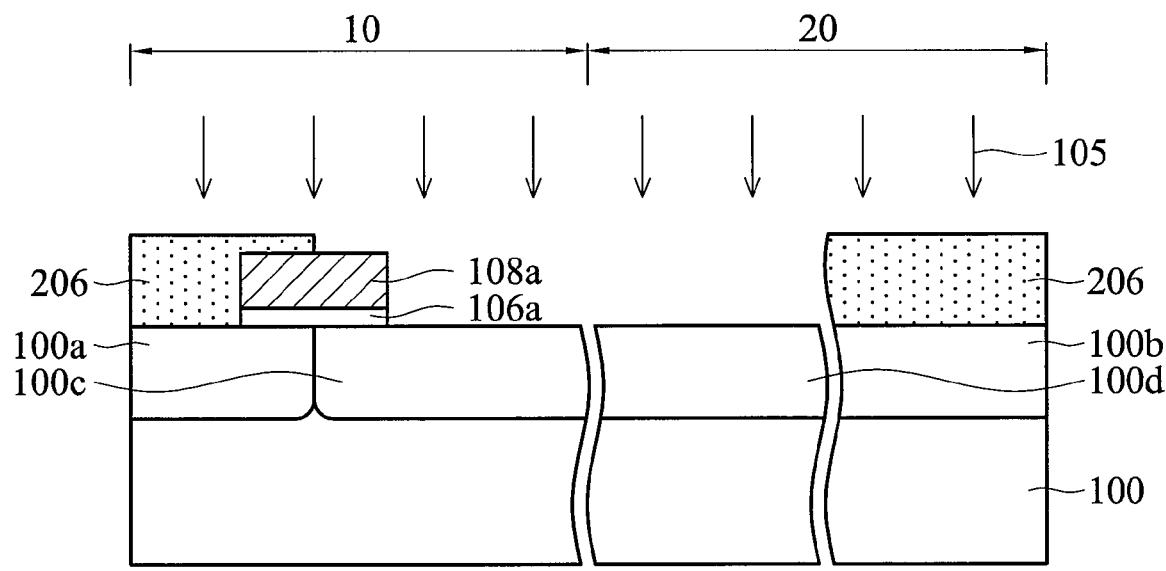
Figure 2D:
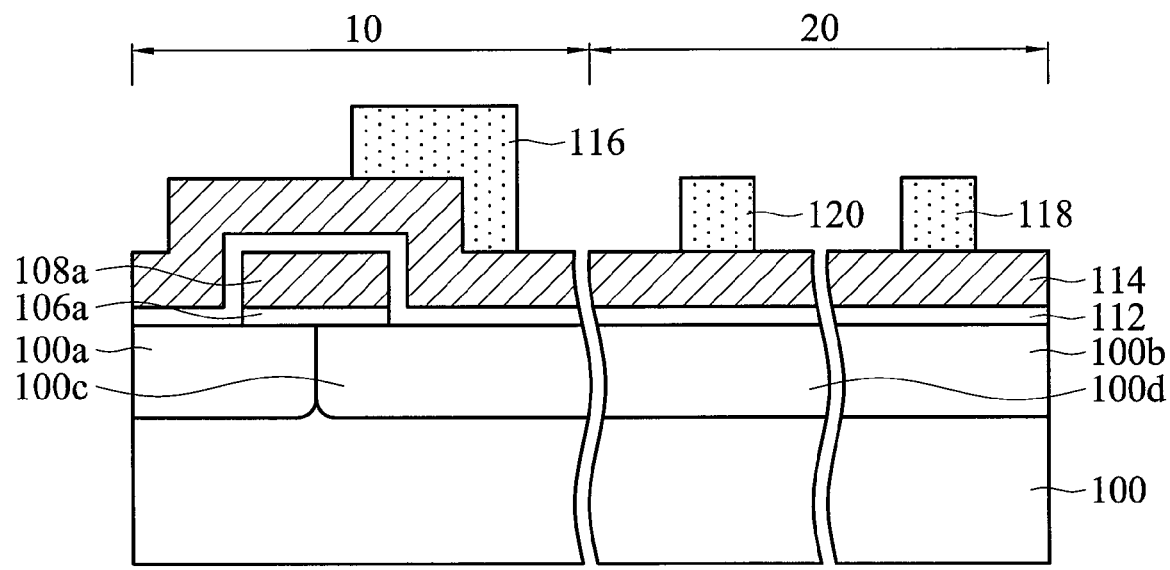
Figure 2E:
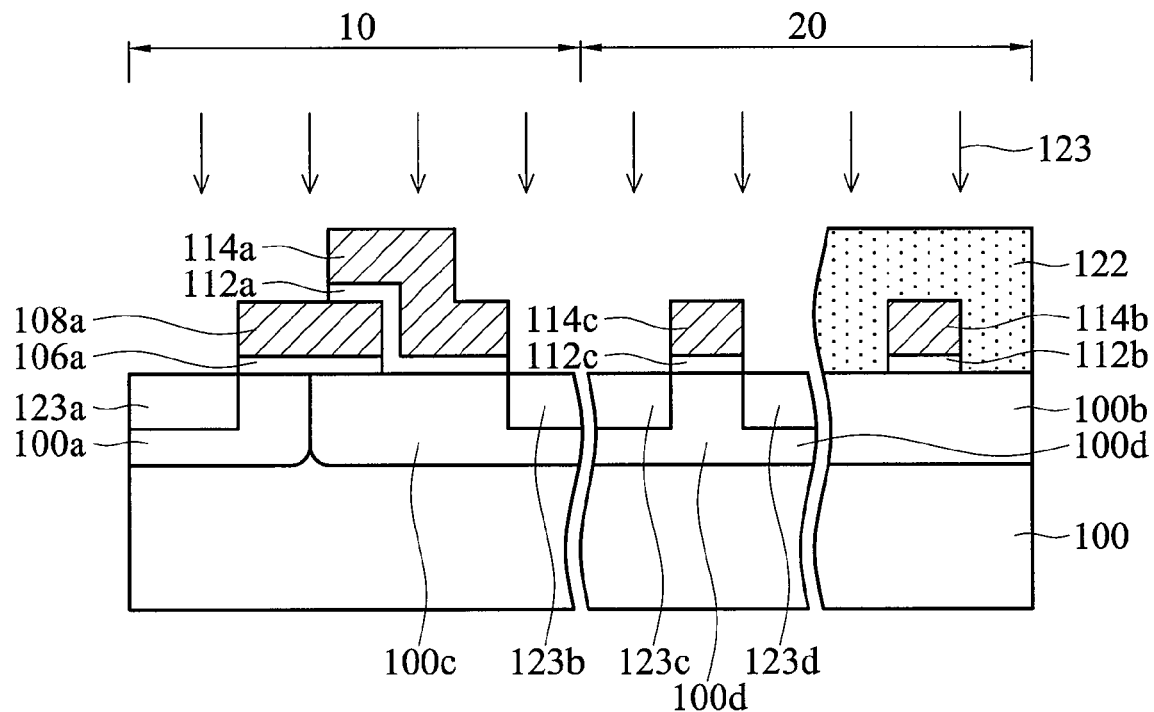
Figure 2F:
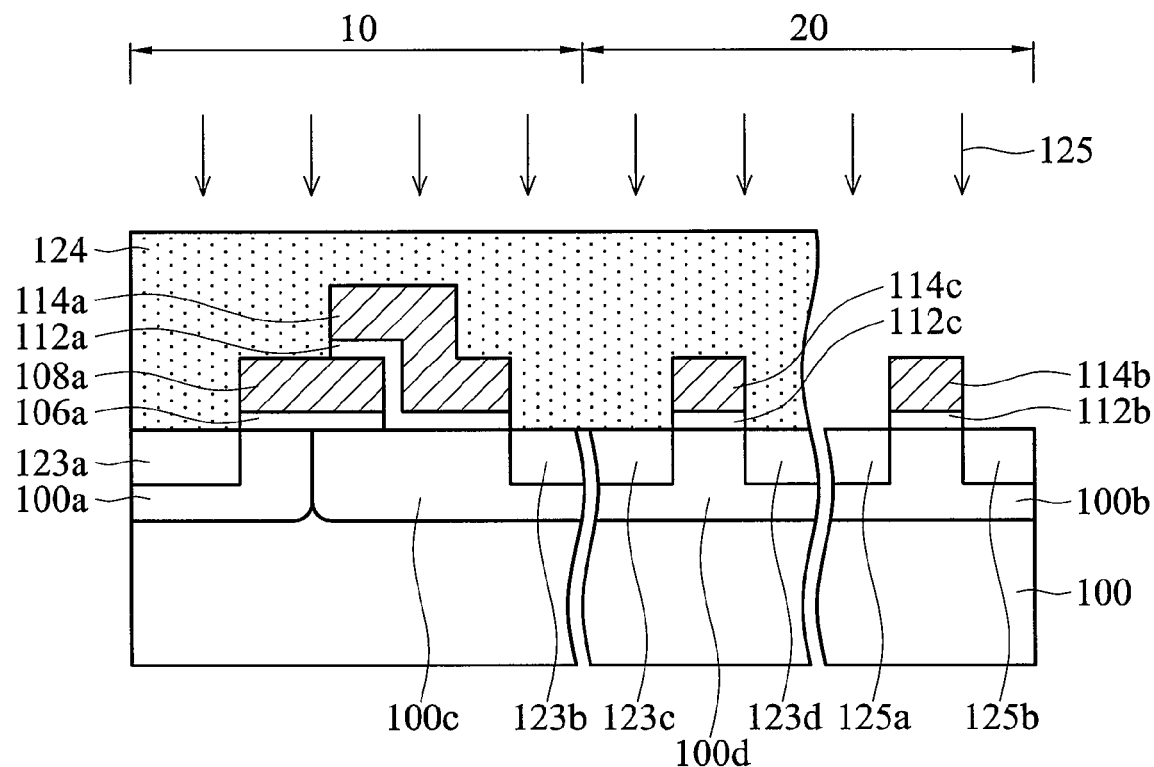
Figure 2G:
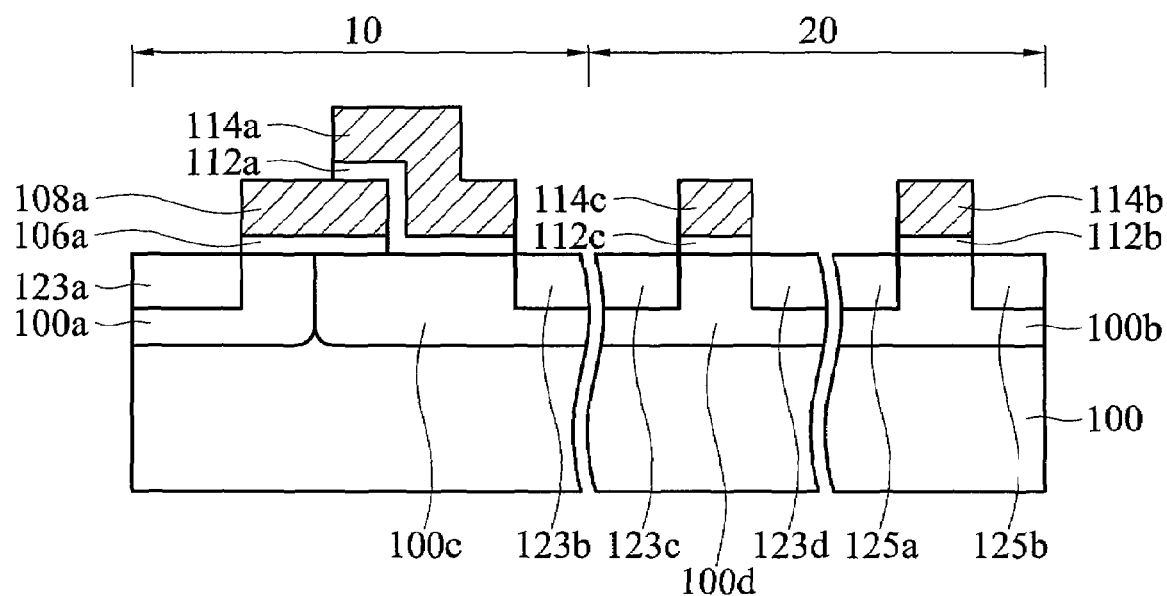
Figure 3:
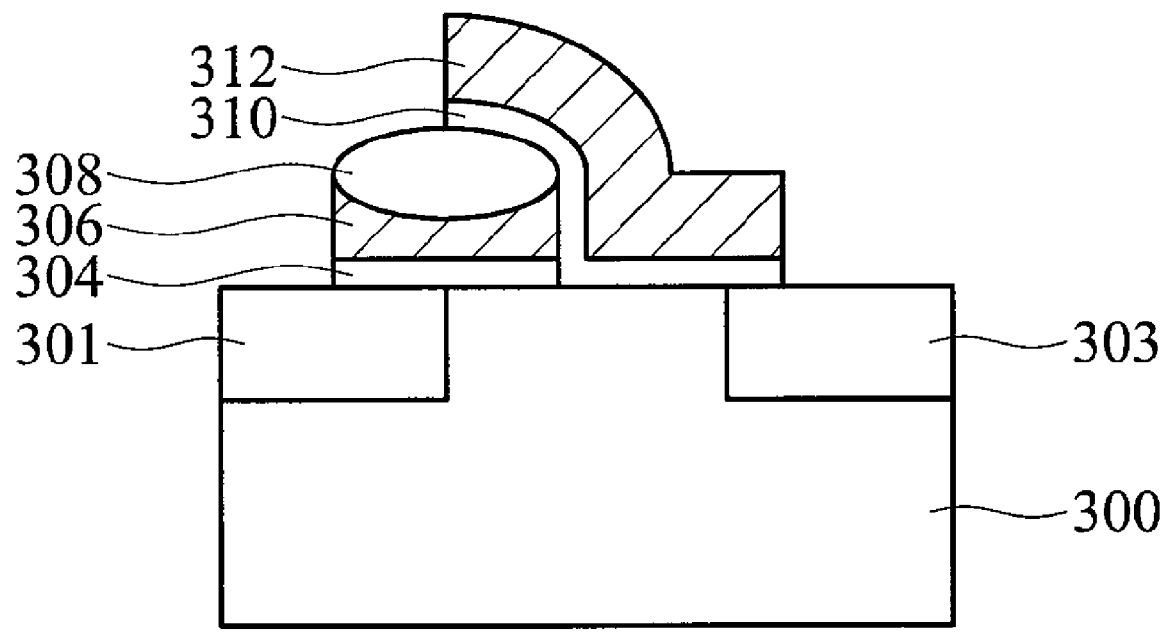
FIG. 3 is a cross section of a conventional split gate memory cell.

FIGS. 2A to 2G illustrate cross sections of another embodiment of a method for forming a semiconductor device with split gate memory cell, in which the same reference numbers as FIGS. 1A to 1G are used, wherefrom like descriptions are omitted. Unlike the above embodiment, the floating gate is formed prior to the formation of the well regions in this embodiment. As shown in FIG. 2A, a substrate 100 having a cell region 10 and a peripheral region 20 is provided. A dielectric layer 106 and a conductive layer 108 are successively formed on the substrate 100 of the cell and peripheral regions 10 and 20. Thereafter, a photoresist layer 202 is formed on a region of the conductive layer 108 for defining a floating gate of the split gate memory cell.

As shown in FIG. 2B, the conductive layer 108 and the underlying dielectric layer 106 uncovered by the photoresist layer 202 are removed by etching to form a floating gate 108a and a floating gate dielectric layer 106a on the substrate of the cell region. After removal of the photoresist layer 202 shown in FIG. 2A, a photoresist layer 204 is formed on a portion of the floating gate 108a and a portion of the substrate 100 of the cell and peripheral regions 10 and 20 by lithography. Ion implantation 103 is performed using the photoresist layer 204 as an implant mask, to form a well region 100a in the cell region 10 and simultaneously form a well region 100b in the peripheral region 20.

As shown in FIG. 2C, after removal of the unnecessary photoresist layer 204 shown in FIG. 2B, a photoresist layer 206 is formed on the substrate 100 by lithography to cover the well regions 100a and 100b and a portion of the floating gate 108a. Ion implantation 105 is performed using the photoresist layer 206 as an implant mask, to form a well region 100c in the cell region 10 and simultaneously form a well region 100d in the peripheral region 20.

As shown in FIGS. 2D to 2E, after performing the same lithography and etching as shown in FIGS. 1D to 1E, a control gate 114a and an intermediate dielectric layer 112a are formed over the sidewall of the floating gate 108a, partially extending to the upper surface of the floating gate 108a. Also, a gate 114b and an underlying gate dielectric layer 112b are simultaneously formed on the substrate 100 of the well region 100b and a gate 114c and an underlying gate dielectric layer 112c are simultaneously formed on the substrate 100 of the well region 100d. Moreover, after formation of the same photoresist layer 122 and performance of the same ion implantation 123 as shown in FIG. 1E, a doping region 123a is formed in the well region 100a near one side of the floating gate 108a, a doping region 123b is formed in the well region 100c near one side of the control gate 114a and a pair of doping regions 123c and 123d is formed in the well region 100d on both sides of the gate 114c. Thus, a split gate memory cell of the invention is completed.

As shown in FIG. 2F, the unnecessary photoresist layer 122 shown in FIG. 2E is removed. After formation of the same photoresist layer 124 and performance of the same ion implantation 125 as shown in FIG. 2E, a pair of doping regions 125a and 125b is formed in the well region 100b on both sides of the gate 114b. The unnecessary photoresist layer 124 is subsequently removed, thus the semiconductor device of the invention is complete, as shown in FIG. 2G.

According to the invention, since the source of the split gate memory cell and the well region for the periphery transistors are formed simultaneously, an additional lithography step for source implantation for split gate memory cell is not required. Moreover, since the intermediate gate dielectric layer between the floating gate and the control gate is simultaneously formed with the formation of the gate dielectric layers for the periphery transistors, an additional lithography step for formation of the intermediate gate dielectric layer for split gate memory cell is also not required. Accordingly, additional lithography steps in manufacturing the split gate memory cells can be reduced to conserve manufacturing costs.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A split gate memory cell, comprising:
   a substrate;
   first and second well regions of respectively a first conductivity type and an opposite second conductivity type juxtaposed in the substrate to form a first junction between the first and second well regions, a second junction at the bottom of the first well region and between the first well region and the substrate, and a third junction at the bottom of the second well region and between the second well region and the substrate;
   a floating gate disposed on the first junction between the first and second well regions and insulated from the substrate;

a control gate disposed over the sidewall of the floating gate and insulated from the substrate and the floating gate, partially extending to the upper surface of the floating gate; and a doping region of the first conductivity type formed within the second well region;

wherein the first well region and the doping region respectively serve as source and drain regions.

2. The split gate memory cell as claimed in claim 1, wherein the floating gate is insulated from the substrate by an oxide layer.

3. The split gate memory cell as claimed in claim 1, wherein the floating gate and the control gate comprise polysilicon.

4. The split gate memory cell as claimed in claim 1, wherein the control gate is insulated from the floating gate and the substrate by an oxide layer.

5. A semiconductor device, comprising:

a substrate having a cell region and a peripheral region;

a split gate memory cell disposed on the substrate of the cell region, comprising:

first and second well regions of respectively a first conductivity type and an opposite second conductivity type juxtaposed in the substrate of the cell region to form a first junction between the first and second well regions, a second junction at the bottom of the first well region and between the first well region and the substrate, and a third junction at the bottom of the second well region and between the second well region and the substrate;

a floating gate disposed on the first junction between the first and second well regions and insulated from the substrate;

a control gate disposed over the sidewall of the floating gate and insulated from the substrate and the floating gate, partially extending to the upper surface of the floating gate; and a first doping region of the first conductivity type formed within the second well region and near one side of the control gate; and a first transistor disposed on the substrate of the peripheral region, comprising:

a third well region of the first conductivity type formed in the substrate;

a first gate disposed on the substrate of the third well region and insulated therefrom; and a pair of second doping regions of the second conductivity type formed in the third well region on both sides of the first gate.

6. The semiconductor device as claimed in claim 5, further comprising:

a second transistor disposed on the substrate of the peripheral region, comprising:

a fourth well region of the second conductivity type formed in the substrate;

a second gate disposed on the substrate of the fourth well region and insulated therefrom; and a pair of third doping regions of the first conductivity type formed in the fourth well region on both sides of the second gate.

7. The semiconductor device as claimed in claim 6, wherein the control gate, the first gate and the second gate are formed by the same conductive layer.

8. The semiconductor device as claimed in claim 6, wherein the second and fourth well regions are simultaneously and respectively formed in cell and peripheral regions.

9. The semiconductor device as claimed in claim 6, wherein the first doping region and the pair of the third doping regions are simultaneously and respectively formed in the second and fourth well regions.

10. The semiconductor device as claimed in claim 5, wherein the first well region and the first doping region respectively serve as source and drain regions of the split gate memory cell.

11. The semiconductor device as claimed in claim 5, wherein the floating gate is insulated from the substrate by an oxide layer.

12. The semiconductor device as claimed in claim 5, wherein the first and third well regions are simultaneously and respectively formed in cell and peripheral regions.

13. The semiconductor device as claimed in claim 5, wherein the control gate is insulated from the floating gate and the substrate by an oxide layer.

* * * * *